United States Patent
Her et al.

(10) Patent No.: US 10,854,263 B2
(45) Date of Patent: Dec. 1, 2020

(54) STORAGE DEVICE AND METHOD OF OPERATING THE SAME

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Youn Ho Jung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/515,133

(22) Filed: Jul. 18, 2019

(65) Prior Publication Data

US 2020/0202915 A1    Jun. 25, 2020

(30) Foreign Application Priority Data

Dec. 19, 2018  (KR) .................. 10-2018-0165674

(51) Int. Cl.
| | | |
|---|---|---|
| *G11C 11/16* | (2006.01) | |
| *G11C 11/56* | (2006.01) | |
| *G11C 11/408* | (2006.01) | |
| *G11C 11/409* | (2006.01) | |

(52) U.S. Cl.
CPC ........ *G11C 11/1677* (2013.01); *G11C 11/409* (2013.01); *G11C 11/4085* (2013.01); *G11C 11/5628* (2013.01)

(58) Field of Classification Search
CPC ............ G11C 11/1677; G11C 11/4085; G11C 11/409; G11C 11/5628
USPC .................................. 365/189.011
See application file for complete search history.

(56) References Cited

U.S. PATENT DOCUMENTS

| | | | | |
|---|---|---|---|---|
| 7,719,890 B2* | 5/2010 | Gorobets | ............. | G11C 16/102 365/185.04 |
| 8,681,563 B1* | 3/2014 | Lee | ........................ | G11C 16/10 365/185.19 |
| 9,009,398 B2* | 4/2015 | Avila | .................. | G06F 11/1072 711/103 |
| 2010/0124108 A1* | 5/2010 | Sarin | .................. | G11C 16/3427 365/185.03 |
| 2013/0301351 A1* | 11/2013 | Dutta | ................. | G11C 16/3427 365/185.02 |
| 2013/0311710 A1* | 11/2013 | Yang | ...................... | G11C 16/22 711/103 |

(Continued)

FOREIGN PATENT DOCUMENTS

| | | |
|---|---|---|
| KR | 10-2013-0036851 | 4/2013 |
| KR | 10-2014-0139335 | 12/2014 |

*Primary Examiner* — Sung Il Cho
(74) *Attorney, Agent, or Firm* — IP & T Group LLP

(57) ABSTRACT

A memory system includes a memory device including a first memory region of higher density storage and a second memory region of lower density storage; and a controller configured to control the memory device to sequentially perform a backup program operation to the second memory region and perform coarse program and fine program operations to the first memory region for each of data chunks, wherein the controller controls, for at least two among the data chunks, the memory device to first perform the coarse program and then perform the fine program operation, and wherein the controller controls the memory device to perform the backup program operation without a program verify process.

20 Claims, 17 Drawing Sheets

(56) References Cited

U.S. PATENT DOCUMENTS

| | | | | |
|---|---|---|---|---|
| 2014/0185383 A1* | 7/2014 | Shibata | ............... | G11C 11/5628 |
| | | | | 365/185.17 |
| 2015/0170747 A1* | 6/2015 | Liu | ...................... | G11C 16/107 |
| | | | | 365/185.03 |
| 2015/0302920 A1* | 10/2015 | Shibata | .................. | G11C 16/10 |
| | | | | 365/185.03 |
| 2018/0032283 A1* | 2/2018 | Park | ...................... | G06F 3/0656 |

* cited by examiner

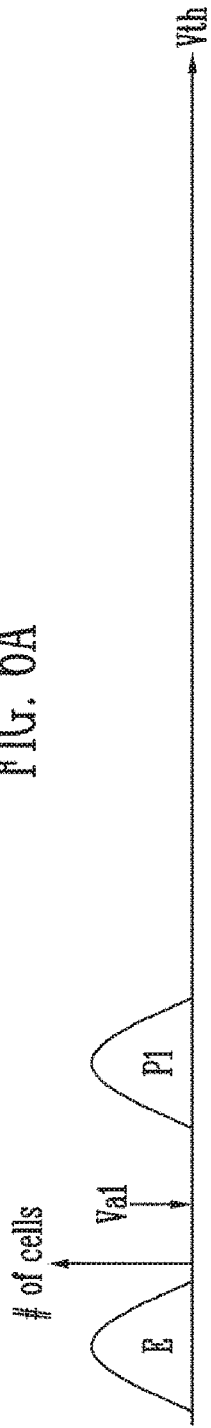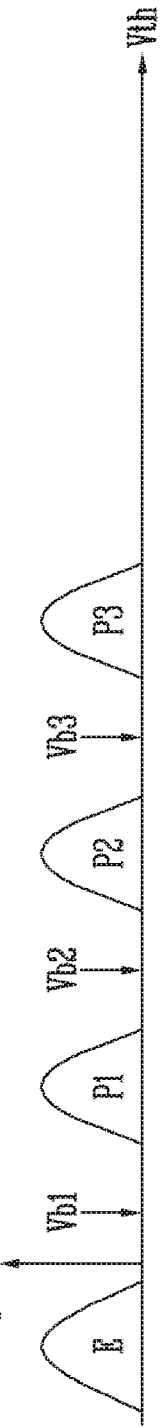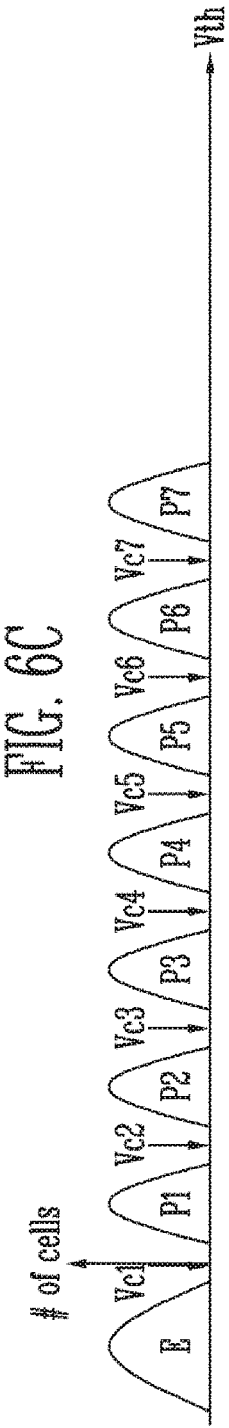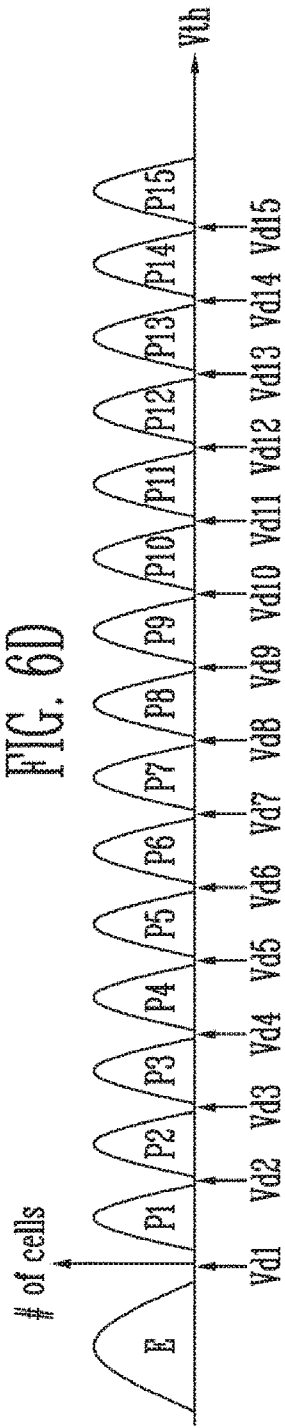

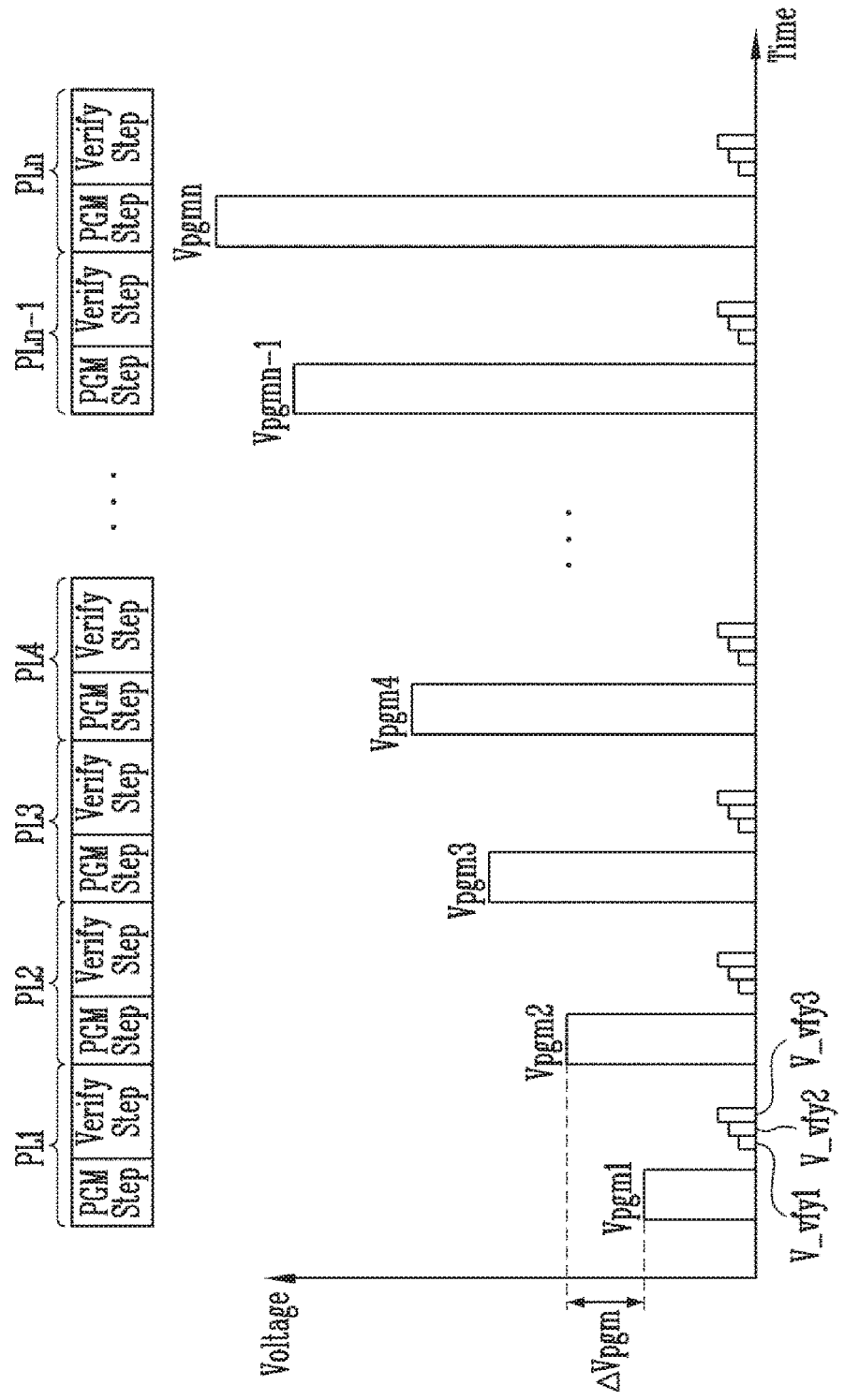

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0165674, filed on Dec. 19, 2018, which is incorporated herein by reference in its entirety.

BACKGROUND

Field of Invention

Various embodiments of the present disclosure generally relate to an electronic device, and more particularly, to a storage device and a method of operating the storage device.

Description of Related Art

Generally, a storage device stores data under control of a host device such as a computer or a smartphone. A storage device may include a memory device configured to store data, and a memory controller configured to control the memory device. Memory devices are chiefly classified into volatile memory devices and nonvolatile memory devices.

A volatile memory device stores data only when power is supplied thereto; data stored therein is lost when power is turned off. Examples of a volatile memory device include a static random access memory (SRAM), and a dynamic random access memory (DRAM).

In a nonvolatile memory device data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device having improved reliability, and a method of operating the storage device.

An embodiment of the present disclosure may provide for a memory controller configured to control a memory device including a first block and a second block, the memory controller including: a memory operation controller configured to generate a plurality of program commands corresponding to a write request received from a host, and provide the plurality of program commands to the memory device; and a program sequence controller configured to determine a sequence in which the memory operation controller provides the plurality of program commands to the memory device, wherein the plurality of program commands includes a main program command for storing a data chunk having a fixed size within write data corresponding to the write request in the first block, and a backup program command for storing the data chunk in the second block, wherein an operation according to the main program command includes a program pulse applying operation of storing the data chunk in the first block, and a program verify operation corresponding to the program pulse applying operation, and wherein an operation according to the backup program command includes a program pulse applying operation of storing the data chunk in the second block.

An embodiment of the present disclosure may provide for a storage device including: a memory device including a first block having memory cells each of which stores n data bits, where n is a natural number greater than m, and a second block having memory cells each of which stores m data bits, where m is a natural number of 1 or more; and a memory controller configured to generate a plurality of program commands corresponding to a write request received from a host, provide the plurality of program commands to the memory device, and determine a sequence in which the plurality of program commands are provided to the memory device, wherein a plurality of program operations according to the plurality of program commands includes a main program operation of storing a data chunk having a fixed size within write data corresponding to the write request in the first block, and a backup program operation of storing the data chunk in the second block, wherein the main program operation includes a program pulse applying operation of storing the data chunk in the first block, and a program verify operation corresponding to the program pulse applying operation, and wherein the backup program operation includes a program pulse applying operation of storing the data chunk in the second block.

An embodiment of the present disclosure may provide for a memory system including: a memory device including a first memory region of higher density storage and a second memory region of lower density storage; and a controller configured to control the memory device to sequentially perform a backup program operation to the second memory region and perform coarse program and fine program operations to the first memory region for each of data chunks, wherein the controller controls, for at least two among the data chunks, the memory device to first perform the coarse program and then perform the fine program operation, and wherein the controller controls the memory device to perform the backup program operation without a program verify process.

BRIEF DESCRIPTION OF THE DRAWINGS

FIG. 6A is a diagram illustrating threshold voltage distributions of memory cells configured to store one data bit in accordance with an embodiment of the present disclosure.

FIG. 6B is a diagram illustrating threshold voltage distributions of memory cells configured to store two data bits in accordance with an embodiment of the present disclosure.

FIG. 6C is a diagram illustrating threshold voltage distributions of memory cells configured to store three data bits in accordance with an embodiment of the present disclosure.

FIG. 6D is a diagram illustrating threshold voltage distributions of memory cells configured to store four data bits in accordance with an embodiment of the present disclosure.

FIG. 7A is a diagram illustrating a normal program operation in accordance with an embodiment of the present disclosure.

DETAILED DESCRIPTION

Figure 1:
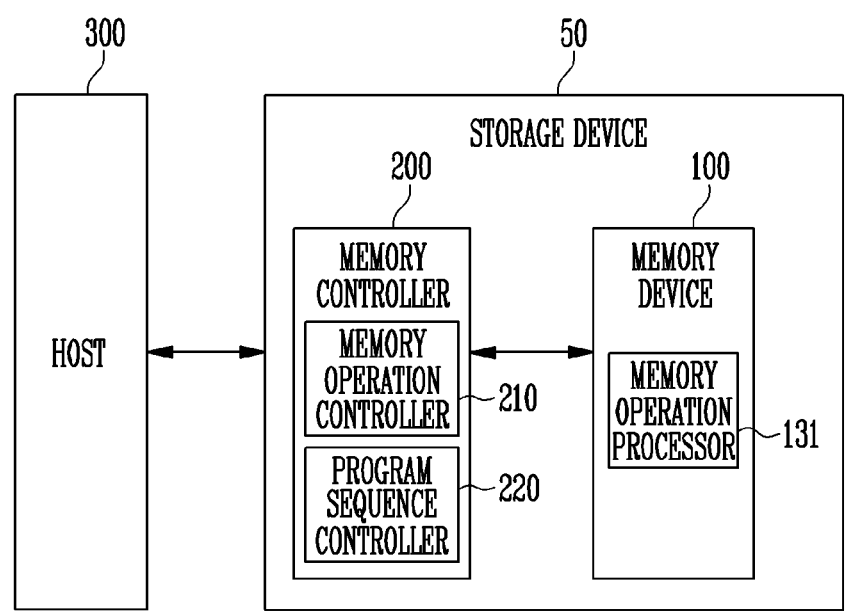
FIG. 1 is a diagram illustrating a storage device in accordance with an embodiment of the present disclosure.

Specific structural and functional description provided herein is directed to the embodiments of the present disclosure. The description, however, should not be construed as being limited to the embodiments described herein.

The present invention may be embodied in many different forms and thus should not be construed as being limited to only the embodiments set forth herein. Rather, the present invention is intended to cover not only the disclosed embodiments, but also various alternatives, modifications, equivalents and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. For example, a first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art are omitted to avoid obscuring the subject matter of the present disclosure. This aims to make the subject matter of the present disclosure clear.

The present disclosure is explained in detail below in the context of various embodiments with reference to the accompanying drawings. Throughout the specification, reference to "an embodiment," "another embodiment" or the like is not necessarily to only one embodiment, and different references to any such phrase are not necessarily to the same embodiment(s).

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be configured as any of various kinds of storage devices depending on a host interface, which is a communication system with the host 300. For example, the data storage device 50 may be configured as any of an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCIe) type storage device, a compact flash (CF) card, a smart media card, and a memory stick.

The storage device 50 may be manufactured in the form of any of various package types. For instance, the storage device 50 may be manufactured as any of a package on package (POP) type, a system in package (SIP) type, a system on chip (SOC) type, a multi-chip package (MCP)

type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100. Each memory block may be the unit of erasing data.

In an embodiment, the memory cell array may include first blocks and second blocks. Memory cells included in each first block may store n data bits (n is a natural number greater than m). Memory cells included in each second block may store m data bits (m is a natural number of 1 or more). The first block may be a main block configured to store data. The second block may be a backup block configured to store data. A program operation of storing data in the first block may be performed using data stored in the second block.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). In this specification, by way of example, aspects of the present invention are described in a context in which the memory device 100 is a NAND flash memory.

The memory device 100 may receive a command and an address from the memory controller 200 and access an area of the memory cell array that is selected by the address. In other words, the memory device 100 may perform an operation corresponding to the command on the area selected by the address. For example, the memory device 100 may 15 perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from 20 an area selected by an address.

In an embodiment, the memory device 100 may include a memory operation processor 131.

The memory operation processor 131 may perform a program operation of storing data in memory cells in response to a program command provided from the memory controller 200.

The memory operation processor 131 may perform a backup program operation in response to a backup program command provided from the memory controller 200. The backup program operation may be an operation of storing data in memory cells in a second block. In an embodiment, the backup program operation may include a program voltage applying operation without a program verify operation. The program voltage applying operation is also referred to as a program pulse applying operation.

The memory operation processor 131 may perform a pre-program operation in response to a pre-program command provided from the memory controller 200. The memory operation processor 131 may perform a post-program operation in response to a post-program command provided from the memory controller 200. The pre-program operation may include storing data in memory cells in a first block. The post-program operation may include storing again the identical data in the memory cells in the first block. A post-program operation corresponding to the pre-program operation may be performed on the memory cells on which the pre-program operation has been performed.

The memory operation processor 131 may perform an operation of reading data stored in memory cells in response to a read command provided from the memory controller 200. The memory operation processor 131 may perform an erase operation of erasing data stored in memory cells in response to an erase command provided from the memory controller 200.

The memory controller 200 may control overall operations of the storage device 50.

When power is applied to the storage device 50, the memory controller 200 may execute firmware. In the case where the memory device 100 is a flash memory device, the memory controller 200 may execute firmware such as a flash translation layer (FTL) for controlling communication between the host 300 and the memory device 100.

In an embodiment, the memory controller 200 may receive data and a logical block address (LBA) from the host 300, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host 300. During the program operation, the memory controller 200 may provide a program command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a program command, an address and data in the absence of a request from the host 300, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control two or more memory devices 100. In this case, the memory controller 200 may control the memory devices 100 in an interleaving manner so as to enhance the operating performance. The interleaving scheme may enable operating periods of two or more memory devices 100 to overlap.

In an embodiment, the memory controller 200 may include a memory operation controller 210 and a program sequence controller 220.

The memory operation controller 210 may generate a plurality of program commands corresponding to a write request received from the host. Write data corresponding to the write request may be divided into a plurality of data chunks each having a set size. The memory operation controller 210 may generate a plurality of program commands corresponding to the respective write data chunks (simply data chunk(s) below). The memory operation controller 210 may provide the generated program commands to the memory device 100.

In an embodiment, a backup program command for instructing to perform a backup program operation of storing a data chunk in the second block may be provided to the memory device 100. The memory operation controller 210 may provide, to the memory device 100, a pre-program command for instructing the memory device 100 to perform a pre-program operation of storing the data chunk in the first block. The memory operation controller 210 may provide, to the memory device 100, a post-program command for instructing the memory device 100 to perform a post-program operation of storing again the data chunks in the first block.

The memory operation controller 210 may provide the backup program command, the pre-program command, and the post-program command corresponding to each of the plurality of data chunks to the memory device 100 according to a sequence determined by the program sequence controller 220.

In an embodiment, the memory operation controller 210 may control the memory device 100 to perform a post-program operation of storing a data chunk in the first block using the data chunk stored in the second block. For example, the memory operation controller 210 may provide a read command for reading the data chunk stored in the second block to the memory device 100. The memory operation controller 210 may provide, using the data chunk obtained in response to the read command, a post-program command corresponding to the data chunk to the memory device 100.

In an embodiment, the memory operation controller 210 may control the memory device 100 such that, when a main program operation that is being performed by the memory device 100 is interrupted by sudden power off, the memory device 100 re-performs the main program operation using the data chunk stored in the second block. The main program operation may be an operation of storing a data chunk in the first block. The sudden power off may be an event in which power to be supplied to the storage device 50 is interrupted.

In an embodiment, when the main program operation of storing a data chunk in the first block is completed, the memory operation controller 210 may erase the second block that stores the corresponding data chunk. For example, when an operation of storing, in the first block, all of the data chunks stored in the second block is completed, the memory operation controller 210 may provide a command for erasing the selected second block to the memory device 100.

The program sequence controller 220 may determine a sequence in which the memory operation controller 210 provides a plurality of program commands corresponding to the respective data chunks to the memory device 100. The data chunks may be obtained by dividing the write data corresponding to the write request received from the host into set sizes. The set size may be determined depending on a write policy or the size of data to be programmed during a single process.

The program sequence controller 220 may determine a command providing sequence such that the memory operation controller 210 provides a backup program command corresponding to a data chunk to the memory device 100 and thereafter provides a pre-program command corresponding to the data chunk to the memory device 100.

The program sequence controller 220 may determine a command providing sequence such that the memory operation controller 210 provides the pre-program command corresponding to the data chunk to the memory device 100 and thereafter provides a post-program command corresponding to the data chunk to the memory device 100.

The program sequence controller 220 may determine a command providing sequence such that, before the memory operation controller 210 provides the post-program command corresponding to the data chunk to the memory device 100, the memory operation controller 210 provides a backup program command or a pre-program command corresponding to another data chunk to the memory device 100.

For example, under control of the program sequence controller 220, the memory operation controller 210 may provide a backup program command and a pre-program command corresponding to a first data chunk, provide a backup program command and a pre-program command corresponding to a second data chunk, and thereafter provide a post-program command corresponding to the first data chunk.

The host 300 may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
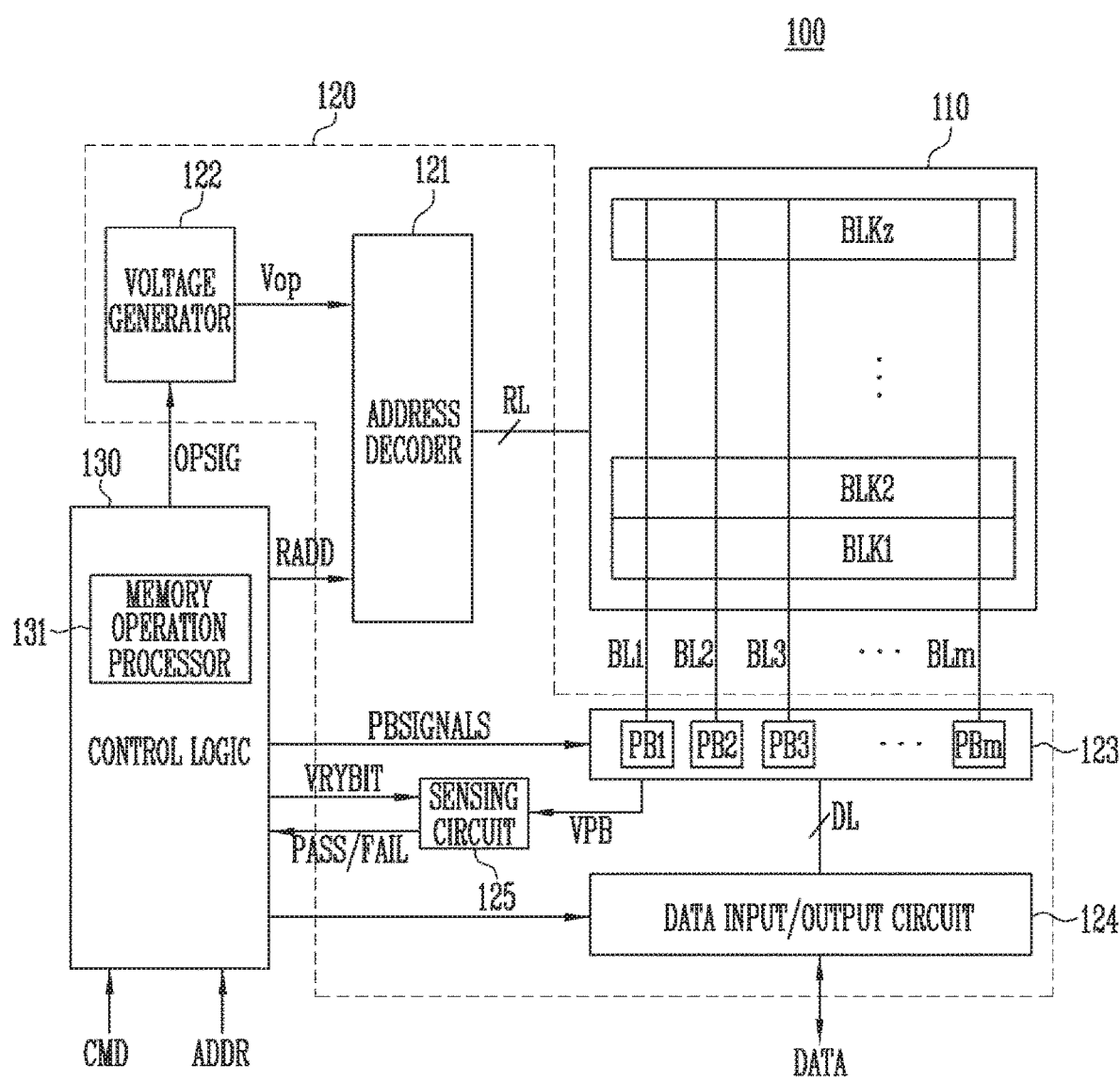
FIG. 2 is a diagram illustrating a configuration of a memory device, such as that of FIG. 1.

FIG. 2 is a diagram illustrating a configuration of the memory device 100 of FIG. 1.

Referring to FIG. 2, the memory device 100 may include a memory cell array 110, a peripheral circuit 120, and control logic 130.

The memory cell array 110 may include a plurality of memory blocks BLK1 to BLKz, which are coupled to an address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages. In an embodiment, each of the memory blocks BLK1 to BLKz included in the memory cell array 110 may include a plurality of dummy cells. Here, one or more dummy cells may be coupled in series between a drain select transistor and memory cells and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

In an embodiment, the memory cell array 110 may include first blocks and second blocks. Memory cells included in each first block may store n data bits (n is a natural number greater than m). Memory cells included in each second block may store m data bits (m is a natural number of 1 or more).

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, so as to generate a plurality of operating voltages Vop having various voltage levels, a plurality of pumping capacitors configured to receive an internal supply voltage, and may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm, which may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA to the first to m-th page buffers PB1 to PBm.

During an erase operation, the read/write circuit 123 may float the bit lines BL. In an embodiment, the read/write circuit 123 may include a column select circuit.

In an embodiment, while data stored in some page buffers of the plurality of page buffers included in the read/write circuit 123 is programmed to the memory cell array 110, the other page buffers may receive new data from the memory controller 200 and store the new data.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving inputted data DATA. During a program operation, the data input/output circuit 124 may receive data DATA to be stored from an external controller (not shown). During a read operation, the data input/output circuit 124 may output, to the external controller, the data DATA received from the first to m-th page buffers PB1 to PBm included in the read/write circuit 123.

During a read operation or a verify operation, the sensing circuit 125 may generate reference current in response to an enable bit signal VRYBIT generated by the control logic 130, compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD transmitted from an external device.

The control circuit 130 may generate various signals in response to the command CMD and the address ADD and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generator 122, output the row address RADD to the address decoder 121, output the read/write circuit control signal to the read/write circuit 123, and output the enable bit VRYBIT to the sensing circuit 125. Furthermore, the control logic 130 may determine whether target memory cells have passed or failed a verification during the verify operation in response to a pass signal PASS or a fail signal FAIL that is output from the sensing circuit 125.

In an embodiment, the control logic 130 may include the memory operation processor 131.

The memory operation processor 131 may perform a program operation of storing data in memory cells in response to a program command provided from the memory controller 200.

The memory operation processor 131 may perform a backup program operation in response to a backup program command provided from the memory controller 200. The backup program operation may be an operation of storing data in memory cells in a second block. In an embodiment, the backup program operation may include a program voltage applying operation without a program verify operation.

The memory operation processor 131 may perform a pre-program operation in response to a pre-program command provided from the memory controller 200. The memory operation processor 131 may perform a post-program operation in response to a post-program command provided from the memory controller 200. The pre-program operation may include storing data in memory cells in a first block. The post-program operation may include storing again the identical data in the memory cells in the first block. A post-program operation corresponding to the pre-program operation may be performed on the memory cells on which the pre-program operation has been performed.

The pre-program operation and the post-program operation each may include a program voltage applying operation and a program verify operation. Increments of program pulses to be applied during the pre-program operation may be greater than increments of program pulses to be applied during the post-program operation. Program verify voltages of each program loop of the pre-program operation may be lower than program verify voltages of each program loop of the post-program operation.

The memory operation processor 131 may perform an operation of reading data stored in memory cells in response to a read command provided from the memory controller 200. The memory operation processor 131 may perform an erase operation of erasing data stored in memory cells in response to an erase command provided from the memory controller 200.

Figure 3:
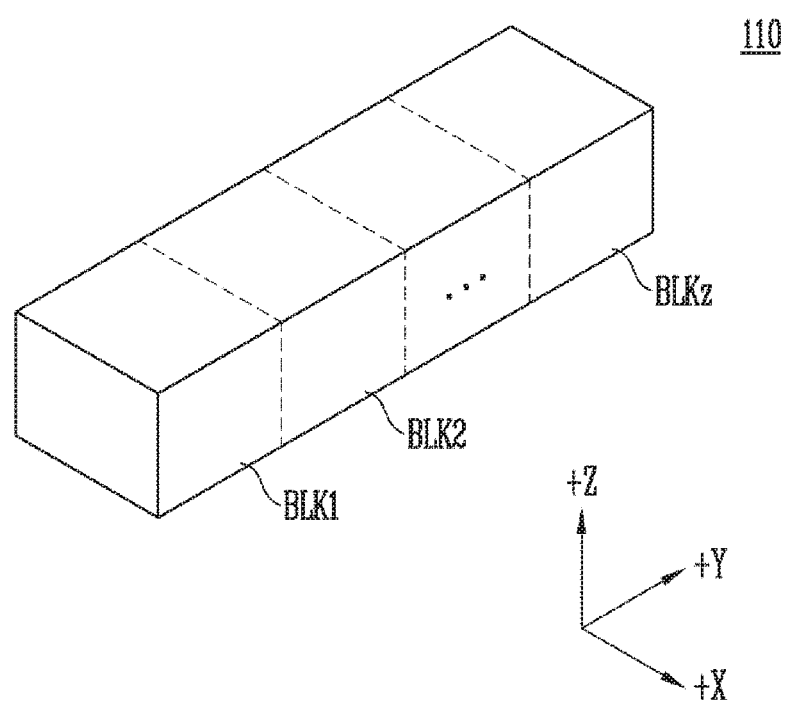
FIG. 3 is a diagram illustrating an embodiment of a memory cell array, such as that of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block has a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
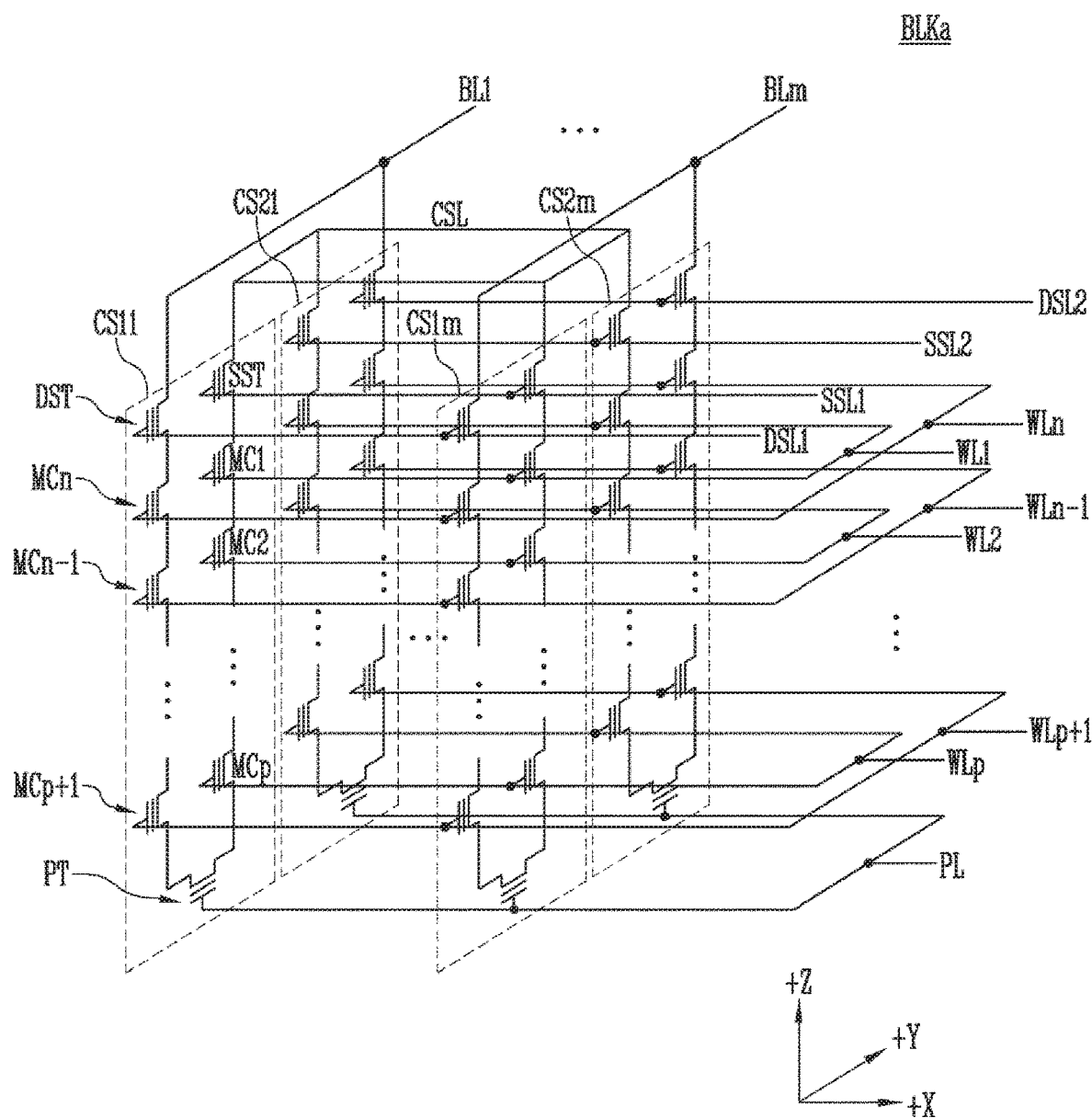
FIG. 4 is a circuit diagram illustrating a representative memory block BLKa of memory blocks BLK1 to BLKz of FIG. 3, in accordance with an embodiment of the present disclosure.

FIG. 4 is a circuit diagram illustrating a representative memory block BLKa of memory blocks BLK1 to BLKz of FIG. 3, in accordance with an embodiment of the present disclosure.

Figure 5:
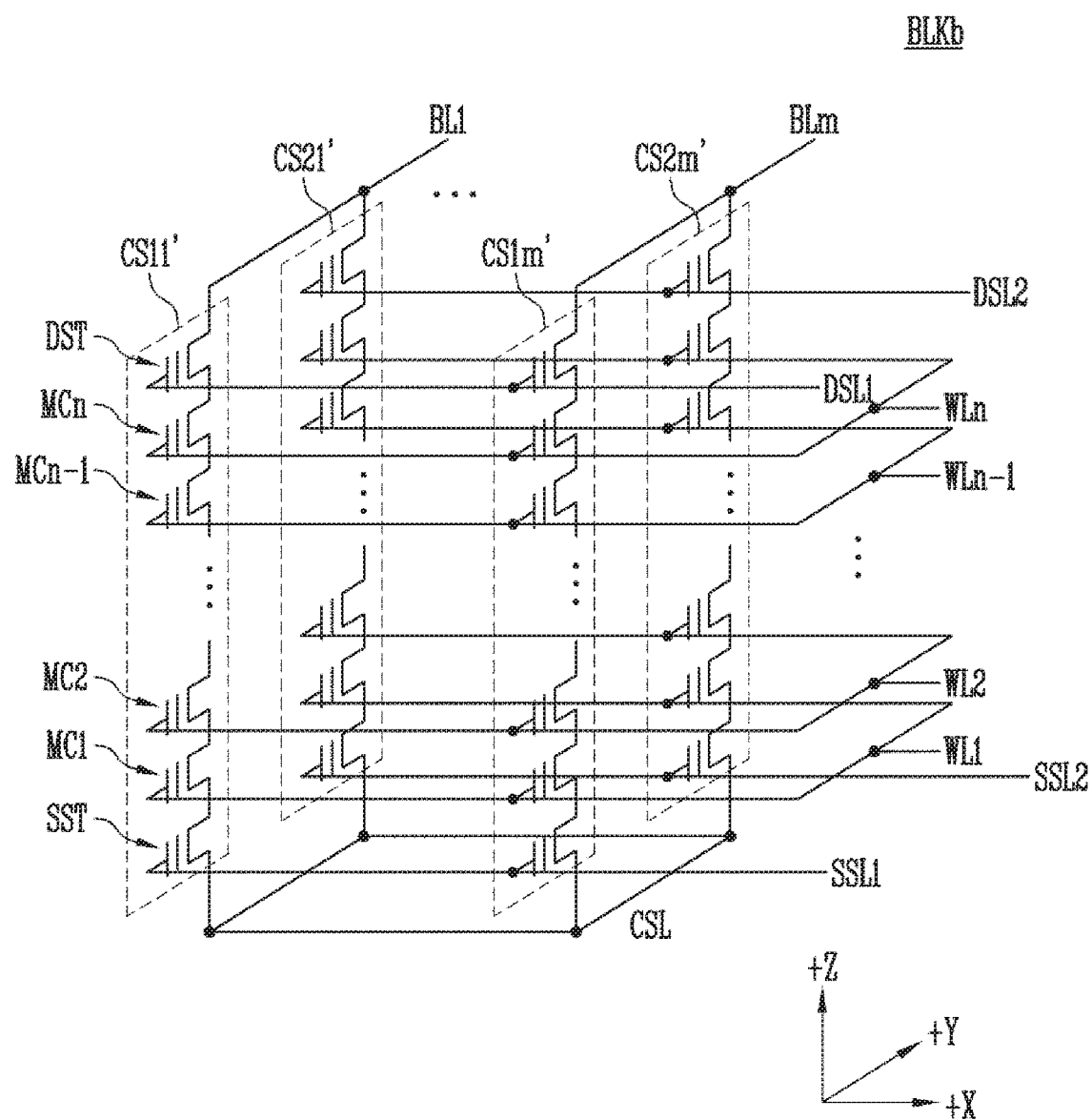
FIG. 5 is a circuit diagram illustrating a representative memory block BLKb of the memory blocks BLK1 to BLKz of FIG. 3, in accordance with an embodiment of the present disclosure.

Referring to FIG. 4, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., the +X direction). In FIG. 5, two cell strings are illustrated as being arranged in a column direction (i.e., the +Y direction). However, this illustration is for clarity; it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a −Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to the respective even bit lines. Odd-number-th cell strings of the cell strings CS11 to CS1m or CS21 to CS2m arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCp. Alternatively, dummy memory cell(s) may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

FIG. 5 is a circuit diagram illustrating a representative memory block BLKb of the memory blocks BLK1 to BLKz of FIG. 3, in accordance with an embodiment of the present disclosure.

Referring to FIG. 5, the memory block BLKb may include a plurality of cell strings CS1' to CS1m' and CS21' to CS2m'. Each of the cell strings CS1' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 5 may have an equivalent circuit similar to that of the memory block BLKa of FIG. 4 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, dummy memory cell(s) may be provided to reduce an electric field between the source select transistor SST and the memory cells MC1 to MCn. Alternatively, dummy memory cell(s) may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

FIG. 6A is a diagram illustrating threshold voltage distributions of memory cells configured to store one data bit in accordance with an embodiment of the present disclosure.

FIG. 6B is a diagram illustrating threshold voltage distributions of memory cells configured to store two data bits in accordance with an embodiment of the present disclosure.

FIG. 6C is a diagram illustrating threshold voltage distributions of memory cells configured to store three data bits in accordance with an embodiment of the present disclosure.

FIG. 6D is a diagram illustrating threshold voltage distributions of memory cells configured to store four data bits in accordance with an embodiment of the present disclosure.

In FIG. 6A to FIG. 6D, the horizontal axis indicates the level of a threshold voltage, and the vertical axis indicates the number of memory cells.

In FIG. 6A to FIG. 6D, it is assumed that the number of data bits that may be stored in each memory cell ranges 1 to 4. However, in another embodiment, more than 4 data bits may be stored in each memory cell.

FIG. 6A illustrates threshold voltage distributions of single-level cells (SLCs) each of which is capable of storing a single data bit. A single-level cell may have an erased status E or a programmed status P1.

A read voltage Val may distinguish the erased status E from the programmed status P1. When a single-level cell having the erased status E is read using the read voltage Val, the single-level cell may be read as an ON cell. When a single-level cell having the programmed status P1 is read using the read voltage Val, the single-level cell may be read as an OFF cell.

FIG. 6B illustrates threshold voltage distributions of multi-level cells (MLCs) each of which is capable of storing two data bits. The multi-level cell may have any one status of an erased status E and first to third programmed statuses P1 to P3.

First to third read voltages Vb1 to Vb3 may distinguish the erased status E and the first to third programmed statuses P1 to P3 from each other. The first read voltage Vb1 may distinguish the erased status E from the first programmed status P1. The second read voltage Vb2 may distinguish the first programmed status P1 from the second programmed status P2. The third read voltage Vb3 may distinguish the second programmed status P2 from the third programmed status P3.

Depending on a result of reading a multi-level cell using the first to third read voltages Vb1 to Vb3, the multi-level cell may be determined to have any one status of the erased status E and the first to third programmed statuses P1 to P3.

FIG. 6C illustrates threshold voltage distributions of triple-level cells (TLCs) each of which is capable of storing three data bits. The triple-level cell may have any one status of an erased status E and first to seventh programmed statuses P1 to P7.

First to seventh read voltages Vc1 to Vc7 may distinguish the erased status E and the first to seventh programmed statuses P1 to P7 from each other. The first read voltage Vc1 may distinguish the erased status E from the first programmed status P1. The second read voltage Vc2 may distinguish the first programmed status P1 from the second programmed status P2. Likewise, the seventh read voltage Vc7 may distinguish the sixth programmed status P6 from the seventh programmed status P7.

Depending on a result of reading a triple-level cell using the first to seventh read voltages Vc1 to Vc7, the triple-level cell may be determined to have any one status of the erased status E and the first to seventh programmed statuses P1 to P7.

FIG. 6D illustrates threshold voltage distributions of quad-level cells (QLCs) each of which is capable of storing four data bits. The quad-level cell may have any one status of an erased status E and first to fifteenth programmed statuses P1 to P15.

First to fifteenth read voltages Vd1 to Vd15 may distinguish the erased status E and the first to fifteenth programmed statuses P1 to P15 from each other. The first read voltage Vd1 may distinguish the erased status E from the first programmed status P1. The second read voltage Vd2 may distinguish the first programmed status P1 from the second programmed status P2. Likewise, the fifteenth read voltage Vd15 may distinguish the fourteenth programmed status P14 from the fifteenth programmed status P15.

Depending on a result of reading a quad-level cell using the first to fifteenth read voltages Vd1 to Vd15, the quad-level cell may be determined to have any one status of the erased status E and the first to fifteenth programmed statuses P1 to P15.

Comparing FIG. 6A to FIG. 6D with each other, as the number of data bits that may be stored in each memory cell is increased, the number of programmed statuses that may be represented by each memory cell and the number of read voltages for distinguishing the respective programmed statuses from each other may be increased. As the number of programmed statuses that may be represented by each memory cell is increased, the entire width in which the threshold voltage distributions corresponding to the respective programmed statuses are disposed may be increased. On the one hand, as the number of programmed statuses that may be represented by each memory cell is increased, the width of the threshold voltage distribution corresponding to each programmed status may be reduced.

FIG. 7A is a diagram illustrating a normal program operation in accordance with an embodiment of the present disclosure.

Referring to FIG. 7A, a normal program operation may include a plurality of program loops PL1 to PLn. When each memory cell is a multi-level cell capable of storing two data bits, the memory device 50 may program selected memory cells by performing a plurality of program loops PL1 to PLn so that each of the memory cells has one of programmed statuses P1, P2, and P3. The number of data bits that may be stored in each memory cell is not limited to that of this embodiment of the present disclosure.

Each of the plurality of program loops PL1 to PLn may include a program voltage application step (PGM Step) of applying a program pulse, and a verify step (Verify Step) of applying verify voltages to determine whether memory cells have been programmed.

For example, when a first program loop PL1 is performed, a first program pulse Vpgm1 is applied and, thereafter, first to third verify voltages V_vfy1 to V_vfy3 are sequentially applied to verify programmed statuses of the memory cells. Here, the first verify voltage V_vfy1 may be used to perform a verify operation on memory cells of which the target status is the first programmed status P1. The second verify voltage V_vfy2 may be used to perform a verify operation on memory cells of which the target status is the second programmed status P2. The third verify voltage V_vfy3 may be used to perform a verify operation on memory cells of which the target status is the third programmed status P3.

Memory cells that have passed the verify operation are determined to have the corresponding target statuses, and thereafter may be program-inhibited in the second program loop PL2. In the second program loop PL2, a second program pulse Vpgm2 higher than the first program pulse Vpgm1 by a unit voltage ΔVpgm is applied so as to program non-program-inhibited memory cells. Subsequently, a verify operation is performed in the same manner as the verify operation of the first program loop PL1. For example, "verify pass" indicates that a memory cell is determined to be an off-cell by a corresponding verify voltage.

As described above, when the memory device programs multi-level cells (MLCs) each of which is capable of storing two data bits, the memory device verifies, using the first to third verify voltages V_vfy1 to V_vfy3, the memory cells of which the target statuses are respective corresponding programmed statuses.

At the verify step, a verify voltage may be applied to a selected word line, which is coupled with the selected memory cells. The page buffers may determine whether the memory cells have passed the verification, based on voltages or currents flowing through bit lines coupled with the respective selected memory cells.

The main program operation described with reference to FIG. 1 may include a pre-program operation and a post-program operation. The pre-program operation and the post-program operation each may be a normal program operation including a program voltage application step (PGM step) and a verify step (Verify Step).

Increments of program pulses to be applied during the pre-program operation may be greater than increments of program pulses to be applied during the post-program operation. Program verify voltages of each program loop of the pre-program operation may be lower than program verify voltages of each program loop of the post-program operation.

Figure 7B:
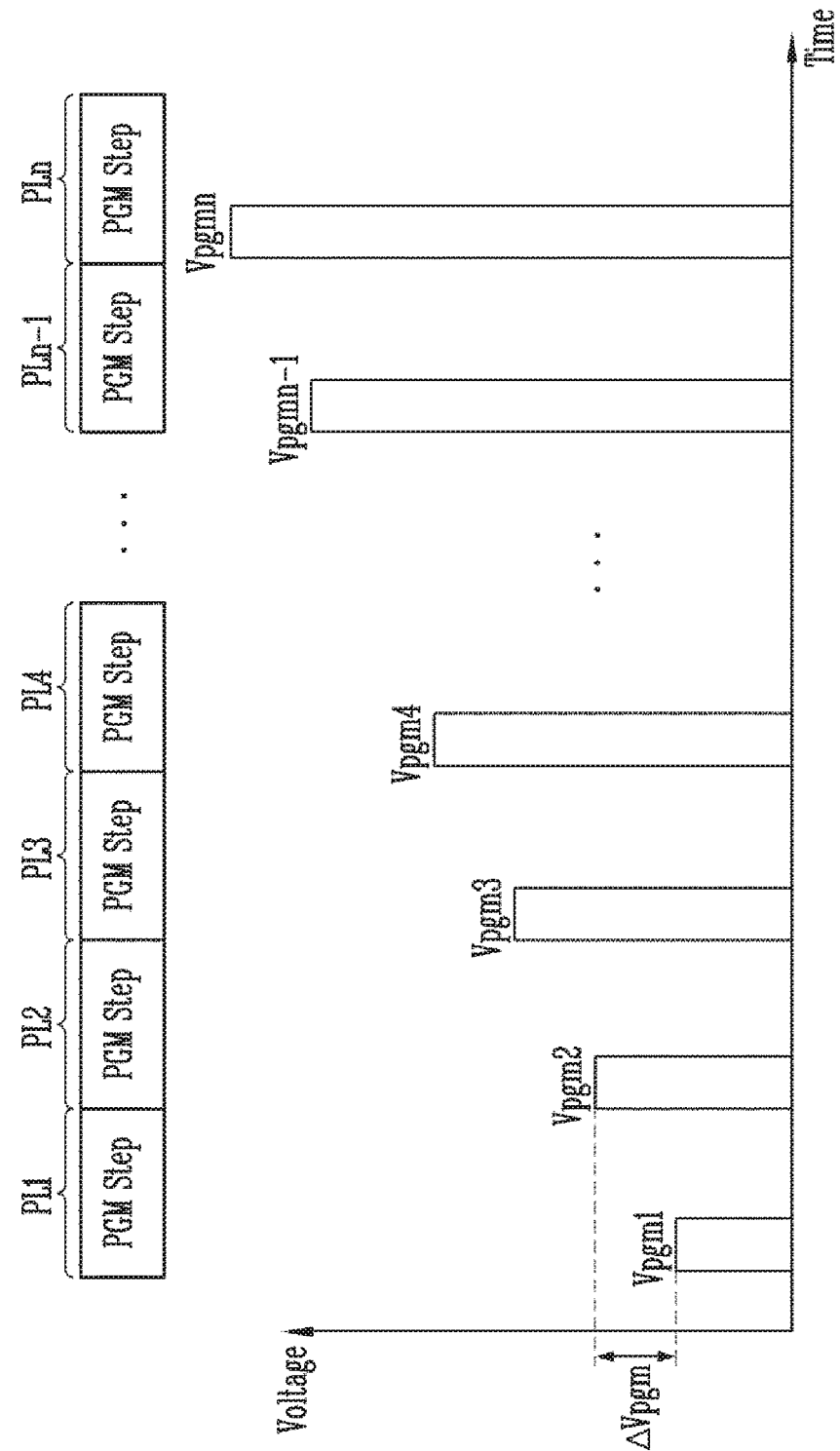
FIG. 7B is a diagram illustrating a backup program operation in accordance with an embodiment of the present disclosure.

FIG. 7B is a diagram illustrating a backup program operation in accordance with an embodiment of the present disclosure.

Referring to FIG. 7B, the backup program operation may include a plurality of program loops PL1 to PLn.

However, unlike the normal program operation described with reference to FIG. 7A, each of the plurality of program loops PL1 to PLn of the backup program operation may include only a program voltage application step (PGM Step) of applying a program pulse without including a verify step of determining whether the memory cells have been programmed by applying verify voltages to the memory cells. Therefore, the time it takes to perform the backup program operation may be reduced compared to that of the normal program operation.

In an embodiment, the backup program operation may be performed on single-level cells.

Referring to FIG. 6A to FIG. 6D, since the number of target statuses that each single-level cell may have is only two, i.e., an erased status and a programmed status, it is less than the number of target statuses that a memory cell capable of storing two or more data bits may have. In the case of the single-level cells, the distance between threshold voltage distributions respectively corresponding to the erase status and the programmed status may be greater than that of memory cells capable of storing two or more data bits. Even if a data error occurs in a single-level cell, because it is a single bit error, there is high probability of recovering data through an error correction coding (ECC) operation, compared to the case where an error occurs in a memory cell capable of storing two or more data bits.

Therefore, the need of a verify operation for a program operation performed on the single-level cell may be lower than that of a program operation performed on the memory cell capable of storing two or more data bits. The verify operation included in the program operation performed on the single-level cell may be omitted or performed less frequently than that of the program operation performed on the memory cell capable of storing two or more data bits.

Figure 8:
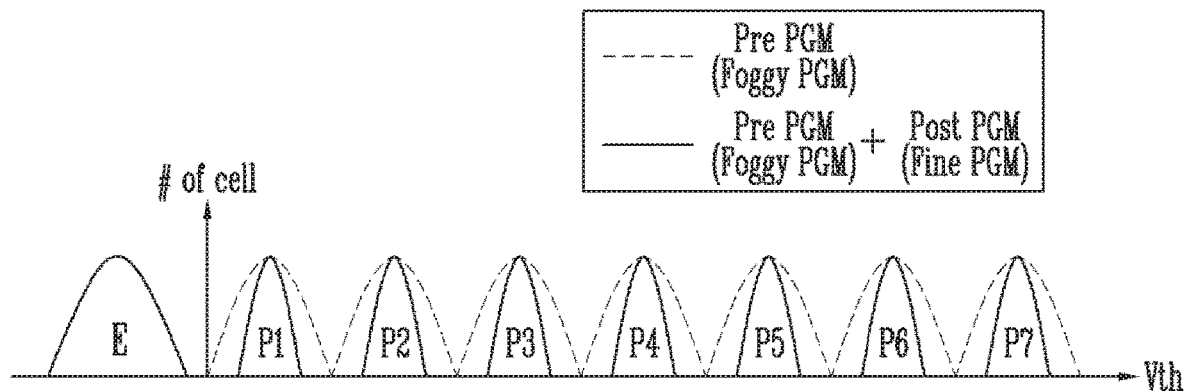
FIG. 8 is a diagram illustrating a configuration of a main program operation in accordance with an embodiment of the present disclosure.

FIG. 8 is a diagram illustrating a configuration of a main program operation in accordance with an embodiment of the present disclosure.

Referring to FIG. 8, memory cells on which the main program operation has been performed may be triple-level cells. Each triple-level cell may have any one status of an erased status E and first to seventh programmed statuses P1 to P7 as a target status.

The main program operation may include a pre-program operation (Pre PGM) and a post-program operation (Post PGM). The pre-program operation may include storing data in a selected word line. The post-program operation corresponding to the pre-program operation may include storing again the identical data in the word line on which the pre-program operation Pre PGM has been performed.

In FIG. 8, threshold voltage distributions of the triple-level cells indicated by the dotted lines may be of the triple-level cells on which the pre-program operation has been performed. Threshold voltage distributions of the triple-level cells indicated by the solid lines may be of the triple-level cells on which the post-program operation has been performed after the pre-program operation has been performed.

In an embodiment, the pre-program operation may be a foggy or coarse program operation (Foggy PGM). The post-program operation may be a fine program operation (Fine PGM). Increments of program pulses to be applied during the foggy program operation may be greater than increments of program pulses to be applied during the fine program operation. Program verify voltages of respective program loops of the foggy program operation may be lower than program verify voltages of respective program loops of the fine program operation.

Hence, in the foggy program operation, a width by which a threshold voltage of each memory cell is shifted from the erased status to a target programmed status may be greater than that during the fine program operation. In the fine program operation, the threshold voltages of memory cells may be more precisely close to a threshold voltage distribution of a target programmed status.

Figure 9:
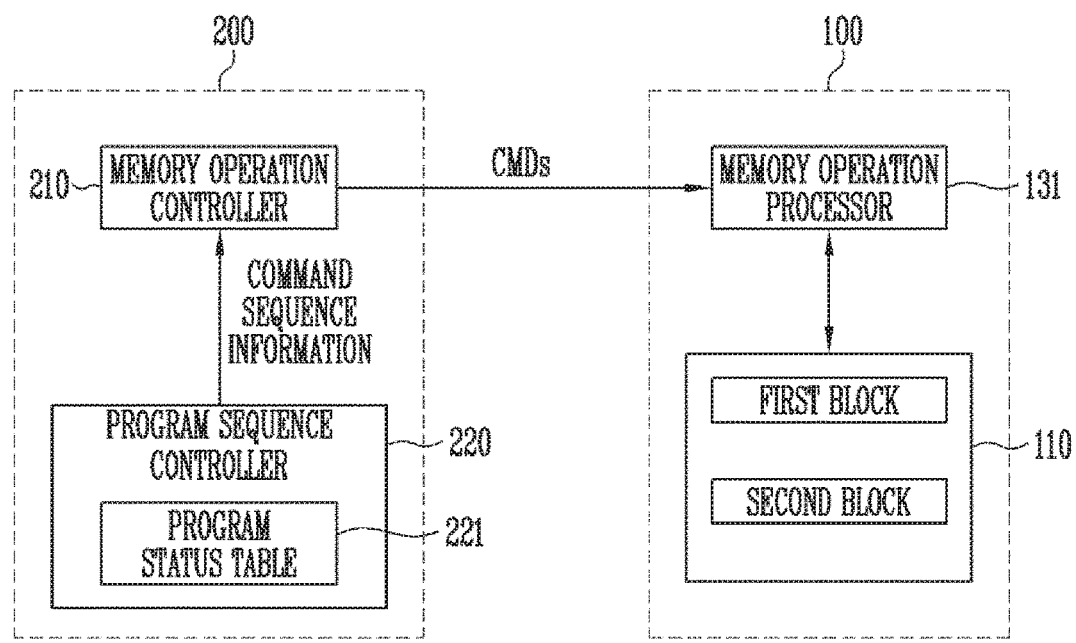
FIG. 9 is a diagram illustrating configuration and operation of a memory controller and a memory device in accordance with an embodiment of the present disclosure.

FIG. 9 is a diagram illustrating a configuration and operation of the memory controller 200 and the memory device 100 in accordance with an embodiment of the present disclosure.

Referring to FIG. 9, the memory device 100 may include the memory cell array 110 and the memory operation processor 131.

In an embodiment, the memory cell array 110 may include first blocks and second blocks. Memory cells included in each first block may store n data bits (n is a natural number greater than m). Memory cells included in each second block may store m data bits (m is a natural number of 1 or more). As a result, the first block provides higher density storage capability than the second block.

The memory operation processor 131 may perform a program operation of storing data in memory cells in response to a program command provided from a memory operation controller 210.

The memory operation processor 131 may perform a backup program operation in response to a backup program command provided from the memory operation controller 210. The memory operation processor 131 may perform a pre-program operation in response to a pre-program command provided from the memory operation controller 210. The memory operation processor 131 may perform a post-program operation in response to a post-program command provided from the memory operation controller 210. The pre-program operation may include storing a data chunk in a selected word line of a first block. The post-program operation corresponding to the pre-program operation may include storing again the identical data chunk in the selected word line.

The memory operation processor 131 may perform an operation of reading data stored in memory cells in response to a read command provided from the memory operation controller 210. The memory operation processor 131 may perform an operation of reading a data chunk stored in a second block in response to a read command provided from the memory operation controller 210.

The memory operation processor 131 may perform an erase operation of erasing data stored in memory cells in response to an erase command provided from the memory operation controller 210. The memory operation processor 131 may perform an operation of erasing a selected second block in response to an erase command provided from the memory operation controller 210.

In an embodiment, the memory controller 200 may include the memory operation controller 210 and the program sequence controller 220.

The memory operation controller 210 may generate a plurality of program commands corresponding to a write request received from the host. Write data corresponding to the write request may be divided into a plurality of data chunks each having a fixed size. The memory operation controller 210 may generate a plurality of program commands corresponding to the respective data chunks. The memory operation controller 210 may provide the generated program commands to the memory operation processor 131.

The memory operation controller 210 may provide a backup program command, a pre-program command, and a post-program command corresponding to each of the plurality of data chunks to the memory device 131 according to command sequence information provided from the program sequence controller 220. The command sequence information may indicate a sequence in which the plurality of program commands are provided to the memory operation processor 131.

For example, according to the command sequence information, the memory operation controller 210 may provide a backup program command and a pre-program command corresponding to a first data chunk to the memory operation processor 131, provide a backup program command and a pre-program command corresponding to a second data chunk thereto, and thereafter provide a post-program command corresponding to the first data chunk thereto.

In an embodiment, the memory operation controller 210 may provide a read command for reading the data chunk stored in the second block to the memory operation processor 131. The memory operation controller 210 may provide, using the data chunk obtained in response to the read command, a post-program command corresponding to the data chunk to the memory operation processor 131.

In an embodiment, when a main program operation that is being performed by the memory operation processor 131 is interrupted by sudden power off, the memory operation controller 210 may provide the main program command to the memory operation processor 131 again. The sudden power off may be an event in which power to be supplied to the storage device described with reference to FIG. 1 is interrupted. The memory operation controller 210 may provide a read command for reading the data chunk stored in the second block to the memory operation processor 131 after the power is supplied to the storage device again. The memory operation controller 210 may again provide, using the data chunk obtained in response to the read command, a main program command corresponding to the data chunk to the memory operation processor 131.

In an embodiment, if the operation of storing the data chunk in the first block is completed, the memory operation controller 210 may provide a command for erasing the second block that has stored the corresponding data chunk to the memory operation processor 131. In detail, when the operation of storing, in a first block, all data chunks stored in a selected second block is completed, the memory operation controller 210 may provide a command for erasing the selected second block to the memory operation processor 131.

The program sequence controller 220 may include a program status table 221. The program status table 221 may include information indicating whether a pre-program operation which is performed on each word line of a first block selected to store data chunks has been completed.

The program sequence controller 220 may generate command sequence information based on the program status table 221. A process of generating the command sequence information based on the program status table 221 is described in detail below with reference to FIG. 11. The command sequence information may indicate a sequence in which a plurality of program commands are provided to the memory operation processor 131. The program sequence controller 220 may provide the generated command sequence information to the memory operation controller 210.

Figure 10:
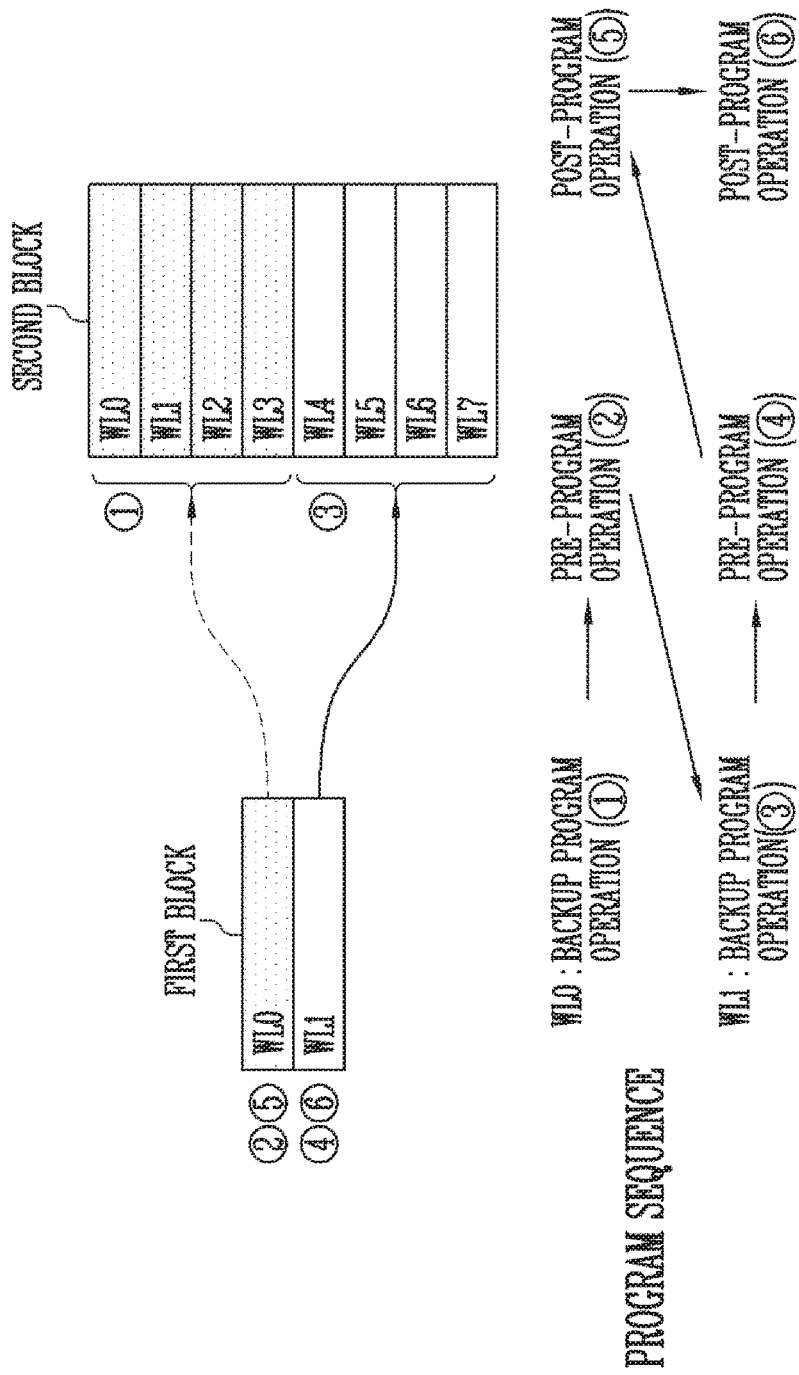
FIG. 10 is a diagram illustrating a backup program operation and a main program operation in accordance with an embodiment of the present disclosure.

FIG. 10 is a diagram illustrating a backup program operation and a main program operation in accordance with an embodiment of the present disclosure.

Referring to FIG. 10, a first block may include zeroth and first word lines WL0 and WL1, and a second block may include zeroth to seventh word lines WL0 to WL7. Memory cells of the first block may be quad-level cells each of which may store four data bits. Memory cells of the second block may be single-level cells each of which may store one data bit. Since the memory cells of the second block are single-level cells and the memory cells of the first block are quad-level cells, the size of data capable of being stored in four word lines of the second block may be equal to the size of data capable of being stored in one word line of the first block.

The number of word lines included in each block and the number of data bits capable of being stored in memory cells of each block are not limited to those of this embodiment.

Data chunks corresponding to a write request received from the host may be respectively stored in different word lines among the word lines included in the first block.

The backup program operation may be an operation of storing a data chunk in word lines of the second block. The backup program operation may include only a program pulse applying operation without a program verify operation.

The main-program operation may include storing a data chunk in a selected word line of the first block. The main program operation may include a pre-program operation and a post-program operation. The pre-program operation may include storing the data chunk in the selected word line of the first block. The post-program operation may include storing again the data chunk in the selected word line of the first block. The pre-program operation and the post program operation each may include a program verify operation and a program pulse applying operation.

In an embodiment, after the pre-program operation is performed on a selected word line of the first block, the post program operation may not be directly performed on the selected word line. After a set time has passed following completion of the pre-program operation on the selected word line, the post-program operation may be performed on the selected word line. If performance of the post-program operation is delayed in this way, stress to be applied to the memory cells coupled to the selected word lines may be reduced, compared to the case where the post-program operation is performed immediately after the pre-program operation is completed. Since the stress to be applied to the memory cells is reduced, the threshold voltage distribution status of the memory cells coupled to the selected word line may be stabilized. If the threshold voltage distribution status is stabilized, the number of data bits which may 20 be stored in each of the memory cells may be increased, and reduction in reliability, which may be caused by a reduction in intervals between threshold voltage distributions, may be mitigated.

Referring to FIG. 10, a backup program operation corresponding to a first data chunk received from the host may be first performed on the zeroth to third word lines WL0 to WL3 of the second block. Thereafter, a pre-program operation corresponding to the first data chunk may be performed on the zeroth word line WL0 of the first block. Subsequently, rather than being immediately performed on the zeroth word line WL0 of the first block after the corresponding pre-program operation is completed, a post-program operation corresponding to the first data chunk may be performed after program operations are performed on other word lines.

Therefore, a backup program operation corresponding to a received second data chunk may be performed on the fourth to seventh word lines WL4 to WL7 of the second block. Thereafter, a pre-program operation corresponding to the second data chunk may be performed on the first word line WL1 of the first block.

Then, the post-program operation corresponding to the first data chunk may be performed on the zeroth word line WL0 of the first block. Subsequently, a post-program operation corresponding to the second data chunk may be performed on the first word line WL1 of the first block.

Figure 11:
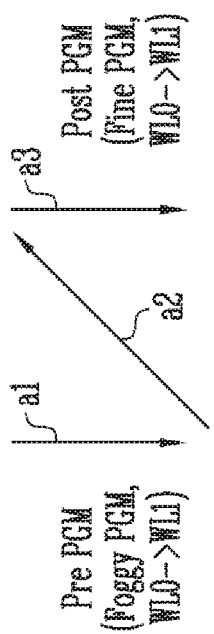
FIG. 11 is a diagram illustrating a program status table, such as that described with reference to FIG. 9.

FIG. 11 is a diagram illustrating a program status table described with reference to FIG. 9.

Referring to FIG. 11, arrows a1 to a3 in portion (a) indicate a process of performing program operations on the zeroth and first word lines WL0 to WL1 of the first block described with reference to FIG. 10.

In an embodiment, the pre-program operation (Pre PGM) may be a foggy or coarse program operation (Foggy PGM) as described with reference to FIG. 9. The post-program operation (Post PGM) may be a fine program operation (Fine PGM) as described with reference to FIG. 9.

During a process indicated by the arrow a1, the pre-program operation is performed on the zeroth word line WL0, and thereafter the pre-program operation may be performed on the first word line WL1. The status indicated by the arrow a2 may represent that the pre-program operation on the zeroth and first word lines WL0 to WL1 has been completed. During a process indicated by the arrow a3, the post-program operation is performed on the zeroth word line WL0, and thereafter the post-program operation may be performed on the first word line WL1.

In an embodiment, since there is a time interval between the pre-program operation and the post-program operation to be performed on the identical word line, the threshold voltage distribution of the memory cells coupled to the word line may be improved.

For example, during the processes indicated by the arrows a1 to a3, the post-program operation on the zeroth word line WL0 may be performed after the pre-program operation on the first word line WL1 has been completed, rather than being performed immediately after the pre-program operation on the zeroth word line WL0 has been performed. Likewise, the post-program operation on the first word line WL1 may be performed after the post-program operation on the zeroth word line WL0 has been completed, rather than being performed immediately after the pre-program operation on the first word line WL1 has been performed.

The program status table may include information indicating whether a pre-program operation which is performed on each word line of the first block selected to store data chunks has been completed.

In FIG. 11, program status tables b1 to b3 may respectively correspond to the processes of performing the program operations corresponding to the arrows a1 to a3. The program status tables b1 to b3 may indicate whether pre-program operations on the zeroth and first word lines WL0 and WL1 of the first block in which respective data chunks are to be stored have been completed.

Based on the program status tables b1 to b3, command sequence information may be generated to indicate a sequence in which a backup program command, a pre-program command, and a post-program command corresponding to each of a plurality of data chunks are provided to the memory device. The command sequence information may be generated such that the backup program command corresponding to a data chunk is provided earlier than the pre-program command corresponding to the data chunk.

For example, referring to the program status table b1, the zeroth word line WL0 may be in a status in which the process of performing the pre-program operation thereon has been completed. The first word line WL1 may be in a status in which the process of performing the pre-program operation thereon has not been completed.

Therefore, the command sequence information may be generated such that the backup program command for the first word line WL1 is provided to the memory device after the pre-program command for the zeroth word line WL0 has been provided to the memory device. Subsequently, the command sequence information may be generated such that the pre-program command for the first word line WL1i is provided to the memory device.

Referring to the program status table b2, the zeroth word line WL0 may be in a status in which the process of performing the pre-program operation thereon has been completed. The first word line WL1 may be in a status in which the process of performing the pre-program operation thereon has been completed.

Therefore, the command sequence information may be generated such that the post program command for the zeroth word line WL0 is provided to the memory device after the pre-program command for the first word line WL1 has been provided to the memory device.

Referring to the program status table b3, the zeroth word line WL0 may be in a status in which the process of performing the post-program operation on the zeroth word line WL0 has been completed. The information about that the process of performing the post-program operation on the zeroth word line WL0 has been completed may be deleted from the program status table. The first word line WL1 may be in a status in which the process of performing the pre-program operation thereon has been completed. However, since the information about the first word line WL1 has not yet been stored in the program status table, the process of performing the post-program operation on the first word line WL1 may not be completed.

Therefore, the command sequence information may be generated such that the post-program command for the first word line WL1 is provided to the memory device after the post-program command for the zeroth word line WL0 has been provided to the memory device.

Figure 12:
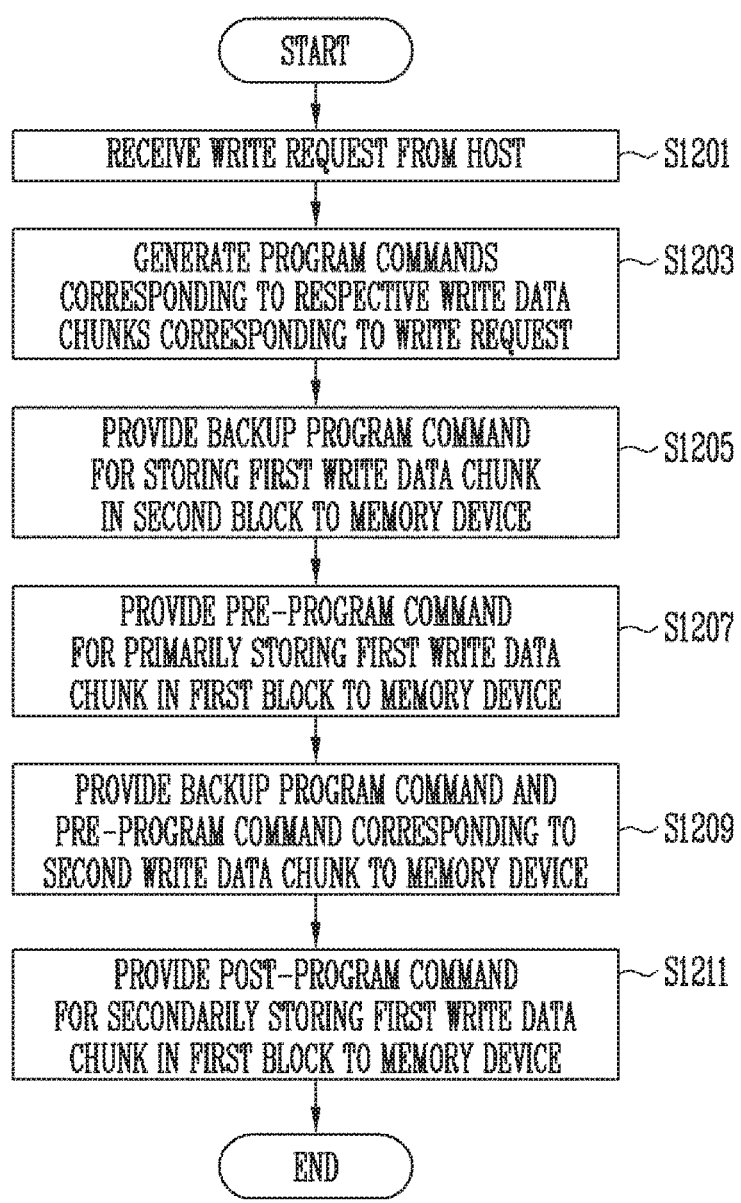
FIG. 12 is a flowchart illustrating an operation of the memory controller in accordance with an embodiment of the present disclosure.

FIG. 12 is a flowchart illustrating an operation of the memory controller in accordance with an embodiment of the present disclosure.

Referring to FIG. 12, at step S1201, the memory controller may receive a write request from the host.

At step S1203, the memory controller may generate a plurality of program commands that correspond to each of the data chunks corresponding to the write request. The plurality of program commands may include a main program command for storing a data chunk in the first block, and a backup program command for storing the data chunk in the second block. The main program command may include a pre-program command for storing the data chunk in the first block, and a post-program command for storing again the data chunk in the first block.

At step S1205, the memory controller may provide a backup program command for storing a first data chunk in the second block to the memory device. An operation according to the backup program command may include only a program voltage applying operation without a program verify operation.

At step S1207, the memory controller may provide a pre-program command for storing the first data chunk in the first block to the memory device. An operation according to the pre-program command may include a program voltage applying operation and a program verify operation.

At step S1209, the memory controller may provide a backup program command and a pre-program command that correspond to a second data chunk to the memory device.

At step S1211, the memory controller may provide a post-program command for storing again the first data chunk in the first block to the memory device. An operation according to the post-program command may include a program voltage applying operation and a program verify operation. The operation according to the post-program command for each data chunk may be performed on the word line on which the operation according to the pre-program command has been performed.

Figure 13:
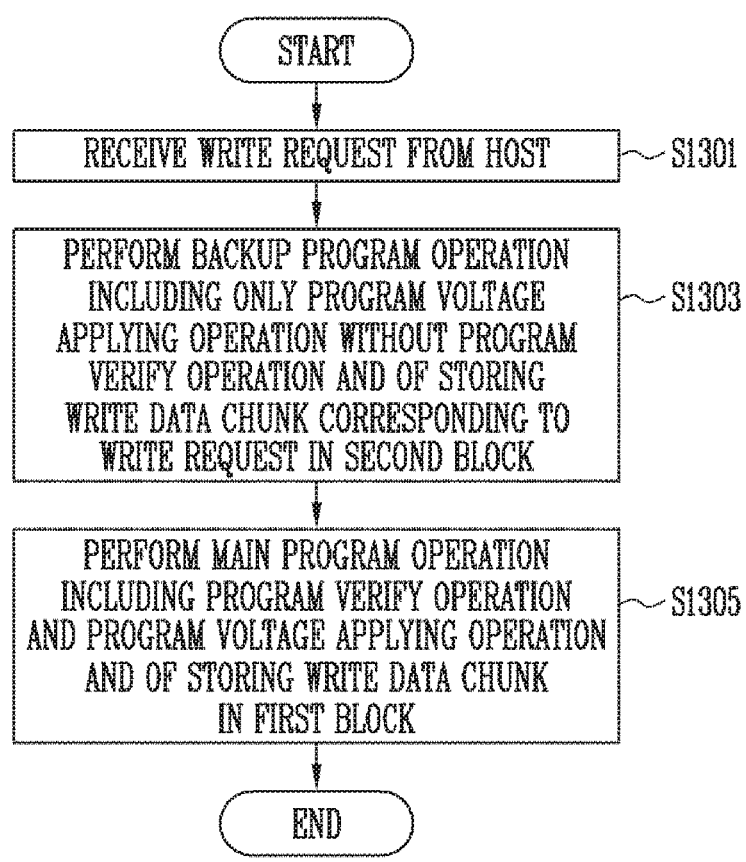
FIG. 13 is a flowchart illustrating an operation of the storage device in accordance with an embodiment of the present disclosure.

FIG. 13 is a flowchart illustrating an operation of the storage device in accordance with an embodiment of the present disclosure.

Referring to FIG. 13, at step S1301, the storage device may receive a write request from the host.

At step S1303, the storage device may perform a backup program operation, including only a program voltage applying operation without a program verify operation, and of storing a data chunk corresponding to the write request in a second block.

At step S1305, the storage device may perform a main program operation including a program verify operation and a program voltage applying operation, and of storing the data chunk in a first block.

Figure 14:
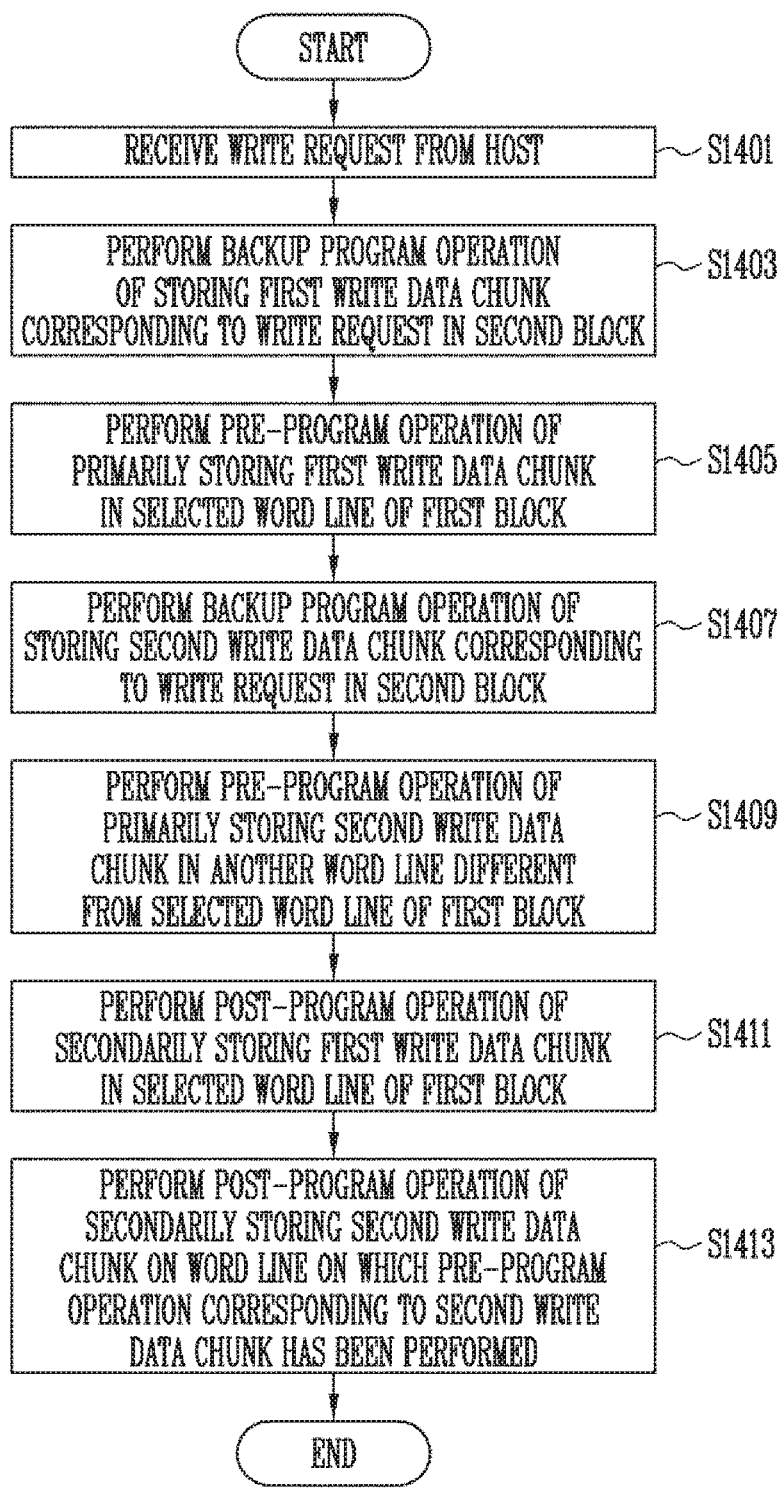
FIG. 14 is a flowchart illustrating an operation of the storage device in accordance with an embodiment of the present disclosure.

FIG. 14 is a flowchart illustrating an operation of the storage device in accordance with an embodiment of the present disclosure.

Referring to FIG. 14, at step S1401, the storage device may receive a write request from the host.

At step S1403, the storage device may perform a backup program operation of storing a first data chunk corresponding to the write request in a second block.

At step S1405, the storage device may perform a pre-program operation of storing the first data chunk in a selected word line of a first block.

At step S1407, the storage device may perform a backup program operation of storing a second data chunk corresponding to the write request in the second block.

At step S1409, the storage device may perform a pre-program operation of storing the second data chunk in another word line different from the selected word line of the first block.

At step S1411, the storage device may perform a post-program operation of storing again the first data chunk in the selected word line of the first block.

At step S1413, the storage device may perform a post-program operation of storing again the second data chunk in the word line on which the pre-program operation corresponding to the second data chunk has been performed.

Figure 15:
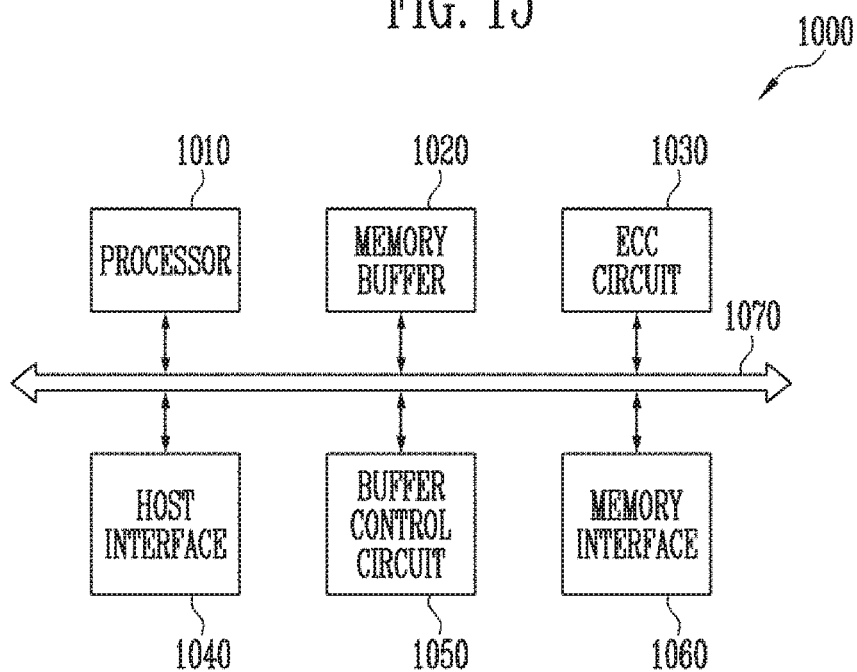
FIG. 15 is a diagram illustrating an example of the memory controller of FIG. 1 in accordance with an embodiment of the present disclosure.

FIG. 15 is a diagram illustrating an example of the memory controller of FIG. 1 in accordance with an embodiment of the present disclosure.

Referring to FIG. 15, a memory controller 1000 is coupled to a host and a memory device. In response to a request from the host, the memory controller 1000 may access the memory device. For example, the memory controller 1000 may control a write operation, a read operation, an erase operation, and a background operation of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. Various address mapping methods may be applied using the FTL depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device 100. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

The memory buffer 1020 may be used as an operating memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device through the channel.

In another embodiment, the memory controller 1000 may include neither the memory buffer 1020 nor the buffer control circuit 1050. Either of these components may be provided separately, or one or both of their functions may be distributed within the memory controller 100.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
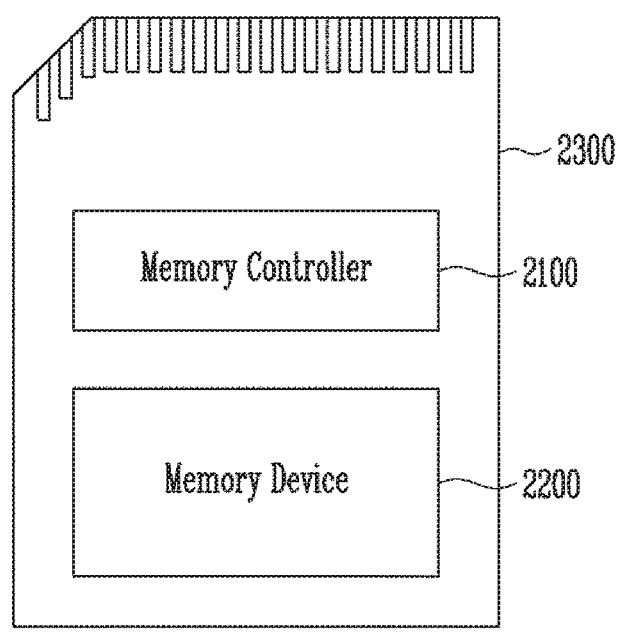
FIG. 16 is a block diagram illustrating a memory card system to which the storage device is applied in accordance with an embodiment of the present disclosure.

FIG. 16 is a block diagram illustrating a memory card system 2000 to which the storage device is applied in accordance with an embodiment of the present disclosure.

Referring FIG. 16, the memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2200 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processor, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols, such as universal serial bus (USB), multimedia card (MMC), embedded MMC (eMMC), peripheral component interconnection (PCI), PCI-express (PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, the memory controller 2100 and the memory device 2200 may be integrated into a single semiconductor device to form a memory card, such as a personal computer memory card international association (PCM-CIA), a compact flash card (CF), a smart media card (SM or SMC), a memory stick, a multimedia card (MMC, RS- MMC, or MMCmicro), a SD card (SD, miniSD, microSD, or SDHC), or a universal flash storage (UFS).

Figure 17:
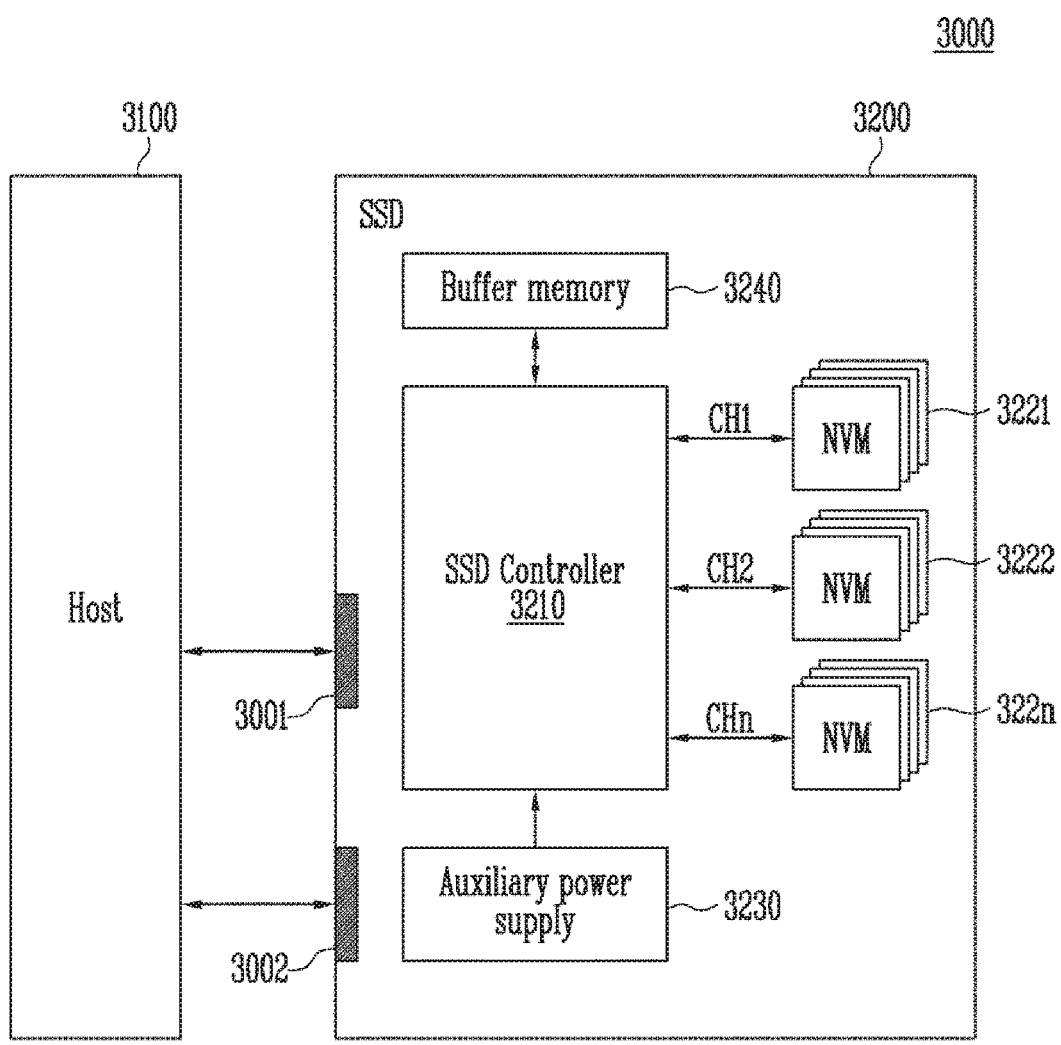
FIG. 17 is a block diagram illustrating a solid state drive (SSD) system to which the storage device is applied in accordance with an embodiment of the present disclosure.

FIG. 17 is a block diagram illustrating a solid state drive (SSD) system 3000 to which the storage device is applied in accordance with an embodiment of the present disclosure.

Referring to FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be based on an interface between the host 3100 and the SSD 3200. For example, the signals SIG may be defined by at least one of various interfaces, such as universal serial bus (USB), multimedia card (MMC), embedded MMC (eMMC), peripheral component interconnection (PCI), PCI-express (PCIe), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be disposed within the SSD 3200 or externally to the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as an FRAM, a ReRAM, an STT-MRAM, and a PRAM.

Figure 18:
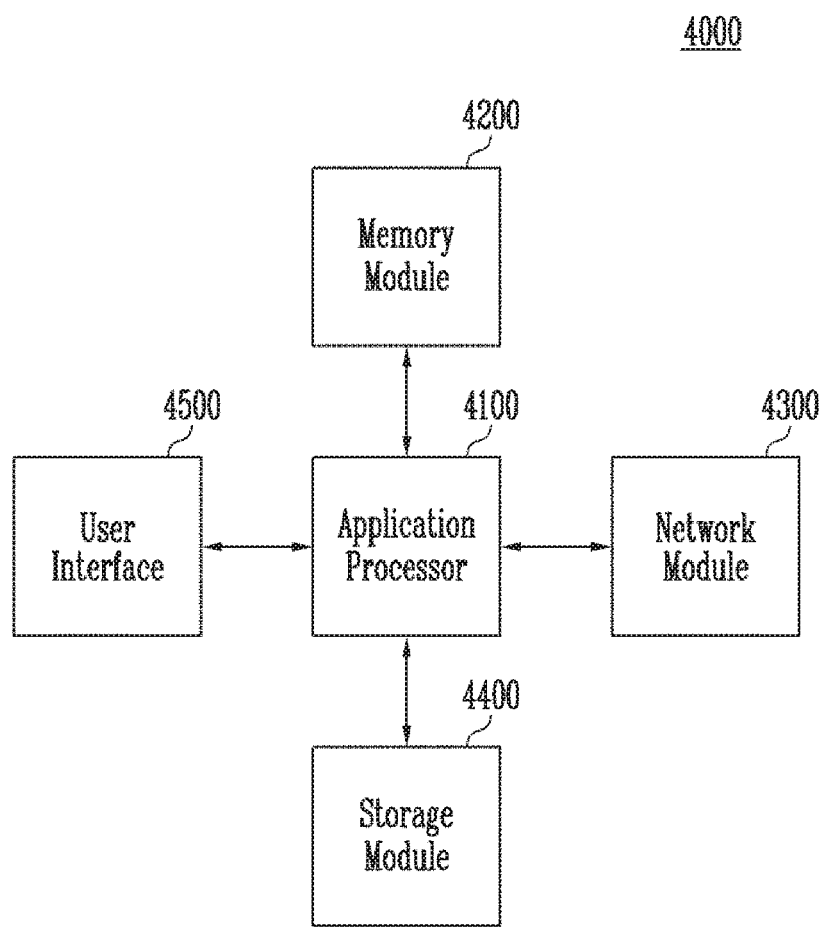
FIG. 18 is a block diagram illustrating a user system to which the storage device is applied in accordance with an embodiment of the present disclosure.

FIG. 18 is a block diagram illustrating a user system 4000 to which the storage device is applied in accordance with an embodiment of the present disclosure.

Referring to FIG. 18, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and a FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or Wi-Fi communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device 100 described above with reference to FIG. 1. The storage module 4400 may be operated in the same manner as that of the storage device 50, described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a motor.

As described above, various embodiments of the present disclosure may provide a storage device having improved reliability, and a method of operating the storage device.

Although embodiments of the present disclosure have been disclosed, those skilled in the art will appreciate in light of the present disclosure that various modifications, additions and substitutions are possible, without departing from the scope and spirit of the present disclosure.

Therefore, the scope of the present invention is defined by the appended claims and equivalents thereof rather than by the description preceding them.

In the above-discussed embodiments, one or more steps may be selectively performed or skipped. In addition, the steps in each embodiment may not be always performed in regular order. Furthermore, the embodiments disclosed herein aim to help those with ordinary knowledge in this art more clearly understand the present disclosure rather than aiming to limit the bounds of the present invention. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter of the present invention. It should be understood that many variations and modifications of the basic inventive concept described herein will still fall within the spirit and scope of the present invention as defined in the appended claims and their equivalents.

What is claimed is:

1. A memory controller configured to control a memory device including a first block and a second block, the memory controller comprising:
    a memory operation controller configured to generate a plurality of program commands corresponding to a write request received from a host, and provide the plurality of program commands to the memory device; and
    a program sequence controller configured to determine a sequence in which the memory operation controller provides the plurality of program commands to the memory device,
    wherein the plurality of program commands includes a main program command for storing a data chunk having a fixed size within write data corresponding to the write request in the first block, and a backup program command for storing the data chunk in the second block,
    wherein an operation according to the main program command includes a program pulse applying operation of storing the data chunk in the first block, and a program verify operation corresponding to the program pulse applying operation, and
    wherein an operation according to the backup program command includes a program pulse applying operation of storing the data chunk in the second block and skips a program verify operation corresponding to the program pulse applying operation by the backup program command.

2. The memory controller according to claim 1,
    wherein the write data is divided into a plurality of data chunks each having the fixed size, and
    wherein the plurality of program commands are generated to respectively correspond to the plurality of data chunks.

3. The memory controller according to claim 2, wherein the plurality of data chunks are respectively stored in different word lines among a plurality of word lines included in the first block.

4. The memory controller according to claim 3, wherein the main program command includes a pre-program command for storing each of the data chunks in the first block, and a post-program command for storing again the data chunk in the first block.

5. The memory controller according to claim 4, wherein each of an operation according to the pre-program command and an operation according to the post-program command include a program pulse applying operation and a program verify operation.

6. The memory controller according to claim 4, wherein the operation according to the post-program command is performed on a word line on which the operation according to the pre-program command has been performed among the plurality of word lines.

7. The memory controller according to claim 4,
    wherein the program sequence controller stores a program status table indicating whether an operation according to the pre-program command has been completed,
    wherein an operation according to the pre-program command is performed on each of the word lines, among the plurality of word lines, in which the respective data chunks are to be stored, and
    wherein the program sequence controller generates, based on the program status table, command sequence information indicating a sequence in which the plurality of program commands are provided to the memory device.

8. The memory controller according to claim 7,
    wherein the memory operation controller provides, based on the command sequence information, a first backup program command and a first pre-program command that correspond to a first data chunk of the plurality of data chunks to the memory device, and
    wherein the memory operation controller provides a first post-program command corresponding to the first data chunk to the memory device after providing a second backup program command and a second pre-program command corresponding to a second data chunk of the plurality of data chunks to the memory device.

9. The memory controller according to claim 8, wherein the memory operation controller provides the first post-program command to the memory device using the first data chunk stored in the second block as a result of performing an operation according to the first backup program command.

10. The memory controller according to claim 8, wherein, among the word lines included in the first block, a word line in which the first data chunk is to be stored and a word line in which the second data chunk is to be stored are adjacent to each other.

11. The memory controller according to claim 4,
    wherein increments of program pulses applied during an operation according to the pre-program command are greater than increments of program pulses applied during an operation according to the post-program command, and
    wherein a program verify voltage of the operation according to the pre-program command is lower than a program verify voltage of the operation according to the post-program command.

12. The memory controller according to claim 1, wherein an operation according to the backup program command is performed before an operation according to the main program command.

13. The memory controller according to claim 12, wherein, when the operation according to the main program command is interrupted by a sudden power off, the memory controller again provides, after power is restored to the memory device, the main program command to the memory device using the data chunk stored in the second block as a result of performing the operation according to the backup program command.

14. The memory controller according to claim 1,
    wherein the second block includes memory cells each of which stores m data bits, where m is a natural number of 1 or more, and wherein the first block includes memory cells each of which stores n data bits, where n is a natural number greater than m.

15. A storage device comprising:
a memory device including a first block having memory cells each of which stores n data bits, where n is a natural number greater than m, and a second block having memory cells each of which stores m data bits, where m is a natural number of 1 or more; and
a memory controller configured to generate a plurality of program commands corresponding to a write request received from a host, provide the plurality of program commands to the memory device, and determine a sequence in which the plurality of program commands are provided to the memory device,
wherein a plurality of program operations according to the plurality of program commands includes a main program operation of storing a data chunk having a fixed size within write data corresponding to the write request in the first block, and a backup program operation of storing the data chunk in the second block,
wherein the main program operation includes a program pulse applying operation of storing the data chunk in the first block, and a program verify operation corresponding to the program pulse applying operation, and
wherein the backup program operation includes a program pulse applying operation of storing the data chunk in the second block and skips a program verify operation corresponding to the program pulse applying operation by the backup program command.

16. The storage device according to claim 15,
wherein the write data is divided into a plurality of data chunks each having the fixed size, and
wherein the plurality of program commands are generated to respectively correspond to the respective data chunks.

17. The storage device according to claim 16,
wherein the plurality of data chunks are respectively stored in different word lines among a plurality of word lines included in the first block,
wherein the main program operation includes a pre-program operation of storing the data chunk in the first block, and a post-program operation of storing again the data chunk in the first block in correspondence with the pre-program operation, and
wherein the post-program operation is performed on a word line on which the pre-program operation has been performed among the plurality of word lines.

18. The storage device according to claim 17,
wherein, under control of the memory controller, the memory device performs a backup program operation of storing a first data chunk of the plurality of data chunks in the second block, and performs a pre-program operation of storing the first data chunk in the first block, and
wherein the memory device performs a backup program operation of storing a second data chunk of the plurality of data chunks in the second block, performs a pre-program operation of storing the second data chunk in the second block, and then performs a post-program operation of storing again the first data chunk in the first block.

19. The storage device according to claim 15,
wherein the backup program operation is performed before the main program operation, and
wherein, when the main program operation is interrupted by a sudden power off, the memory device again performs, under control of the memory controller after power is restored to the storage device, the main program operation using the data chunk stored in the second block as a result of performing the backup program operation.

20. A memory system comprising:
a memory device including a first memory region of higher density storage and a second memory region of lower density storage; and
a controller configured to control the memory device to sequentially perform a backup program operation to the second memory region and perform coarse program and fine program operations to the first memory region for each of data chunks,
wherein the controller controls, for at least two among the data chunks, the memory device to first perform the coarse program and then perform the fine program operation, and
wherein the controller controls the memory device to perform the backup program operation without a program verify process.

* * * * *